United States Patent
Rafferty et al.

(10) Patent No.: US 11,442,359 B2
(45) Date of Patent: Sep. 13, 2022

(54) METHOD OF SEPARATING A TEMPLATE FROM A SHAPED FILM ON A SUBSTRATE

(71) Applicant: CANON KABUSHIKI KAISHA, Tokyo (JP)

(72) Inventors: Tom H. Rafferty, Austin, TX (US); Byung-Jin Choi, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 564 days.

(21) Appl. No.: 16/298,316

(22) Filed: Mar. 11, 2019

(65) Prior Publication Data

US 2020/0292933 A1   Sep. 17, 2020

(51) Int. Cl.
| | | |
|---|---|---|
| G03F 7/00 | (2006.01) | |
| B29C 59/00 | (2006.01) | |
| B29C 59/02 | (2006.01) | |
| B82Y 40/00 | (2011.01) | |
| B82Y 10/00 | (2011.01) | |

(52) U.S. Cl.
CPC .......... *G03F 7/0002* (2013.01); *B29C 59/002* (2013.01); *B29C 59/022* (2013.01); *B82Y 10/00* (2013.01); *B82Y 40/00* (2013.01)

(58) Field of Classification Search
CPC .................................................. G03F 7/0002
See application file for complete search history.

(56) References Cited

U.S. PATENT DOCUMENTS

| | | |
|---|---|---|
| 6,936,194 B2 | 8/2005 | Watts |
| 7,157,036 B2 | 1/2007 | Choi et al. |
| 8,066,930 B2 | 11/2011 | Sreenivasan et al. |
| 8,076,386 B2 | 12/2011 | Xu et al. |
| 8,349,241 B2 | 1/2013 | Sreenivasan et al. |
| 8,444,889 B2 | 5/2013 | Tokue et al. |
| 9,090,014 B2 | 7/2015 | Lu et al. |
| 9,285,675 B2 | 3/2016 | Hamaya et al. |
| 9,400,426 B2 | 7/2016 | Hamaya et al. |
| 2010/0102469 A1 | 4/2010 | Khusnatdinov et al. |
| 2016/0246185 A1* | 8/2016 | Ypma ................. G03F 7/70616 |
| 2018/0117805 A1 | 3/2018 | Choi |

* cited by examiner

*Primary Examiner* — Timothy Kennedy
*Assistant Examiner* — Alexander A Wang
(74) *Attorney, Agent, or Firm* — Daniel Ratoff

(57) ABSTRACT

A method of separating a template from a cured layer on a substrate. Including, sending instructions to move the template away from the cured layer at a first rate, at a second point in time. Including, receiving a first data set as a function of time starting after the second point in time. Including, fitting a model of the first data set to a database of historical data sets. Including, identifying a target data set in the historical data sets based on results of the fit of the model of the first data set and information in the target data set. Including, sending instructions to move the template away from the substrate at a second rate at a third point in time after the second point in time based on the identified target data set.

8 Claims, 6 Drawing Sheets

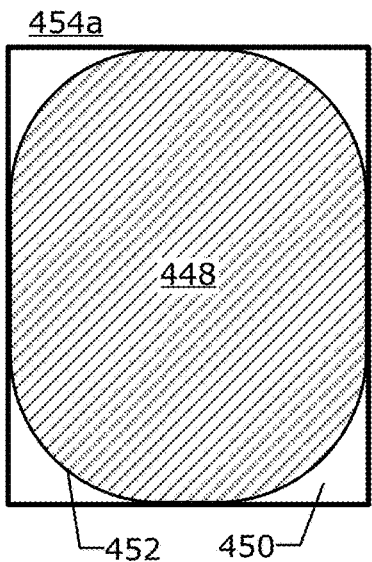
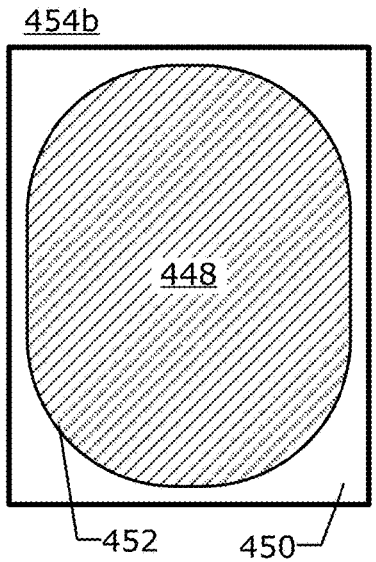
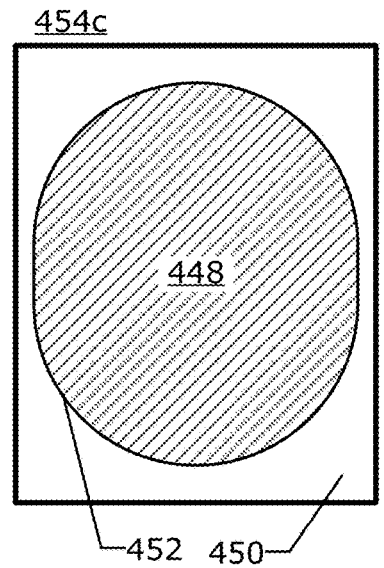
FIG. 4A　　　　　　FIG. 4B　　　　　　FIG. 4C
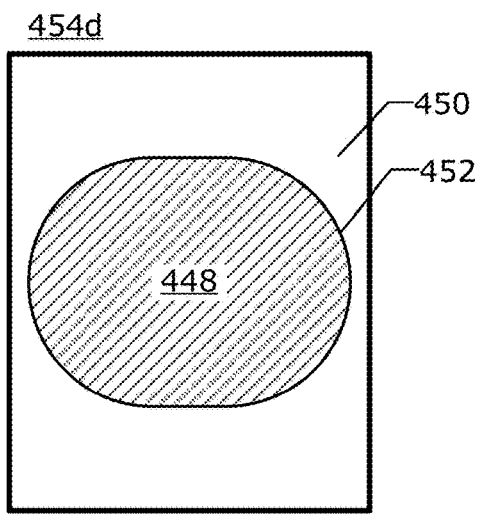
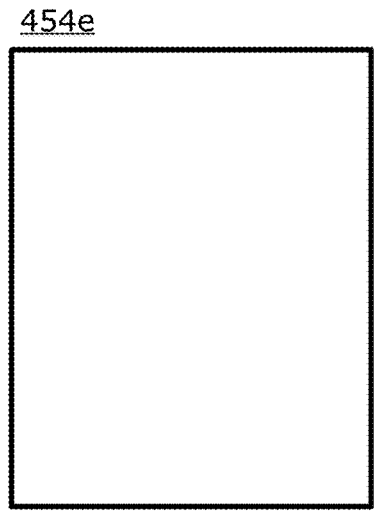
FIG. 4D　　　　　　FIG. 4E

METHOD OF SEPARATING A TEMPLATE FROM A SHAPED FILM ON A SUBSTRATE

BACKGROUND

Field of Art

The present disclosure relates to systems and methods of shaping a film on a substrate with a template.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The patterning process uses a template spaced apart from the substrate and a formable liquid is applied between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer are then subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY

At least a first embodiment, may be a method of separating a template from a cured layer on a substrate. The method may comprise curing formable material between the template and the substrate to form the cured layer, at a first point in time. The method may also comprise sending instructions to a template position controller to move the template away from the cured layer at a first rate, at a second point in time after the first point in time. The method may also comprise receiving a first data set as a function of time starting after the second point in time. The method may also comprise fitting a model of the first data set to a database of historical data sets. The method may also comprise identifying a target data set in the historical data sets based on results of the fit of the model of the first data set and information in the target data set. The method may also comprise sending instructions to the template position controller to move the template away from the substrate at second rate at a third point in time after the second point in time based on the identified target data set.

In an aspect of the first embodiment, the first data set may include: contact area as function of time; template position as function of time; and force applied by the template position controller as function of time.

In an aspect of the first embodiment, the database of data sets may include: a plurality of previously obtained first data sets; and a quality metric associated with each of the plurality of previously obtained first data sets.

In an aspect of the first embodiment, the model may be between: a rate of change of the contact area as function of time; a rate of change of template position as function of time; and rate of change of force applied by the template position controller as function of time.

In an aspect of the first embodiment, the first data set may include separation parameters measured at different points in time. The separation parameter may be representative of a state of separation of the template from the cured layer at a specific point in time.

In an aspect of the first embodiment, the different points in time may include: a first measurement time after the second point in time and before the third point in time; and a second measurement time after the first measurement time and before the third point in time.

At least a second embodiment, may be a method of manufacturing an article from a cured layer on a substrate. The method may comprise curing formable material between a template and the substrate to form the cured layer, at a first point in time. The method may further comprise separating the template from the cured layer on the substrate. Separating a template may further comprise sending instructions to a template position controller to move the template away from the cured layer at a first rate, at a second point in time after the first point in time. Separating a template may further comprise receiving a first data set as a function of time starting after the second point in time. Separating a template may further comprise fitting a model of the first data set to a database of historical data sets. Separating a template may further comprise identifying a target data set in the historical data sets based on results of the fit of the model of the first data set and information in the target data set. Separating a template may further comprise sending instructions to the template position controller to move the template away from the substrate at second rate at a third point in time after the second point in time based on the identified target data set.

An aspect of the second embodiment, may further comprise: dispensing the formable material onto the substrate; sending instructions to the template position controller to bring the template into contact with the formable material on the substrate; processing the substrate after the template has been separated from the cured layer so as to form one or more articles.

In an aspect of the second embodiment, the first data set may include: contact area as function of time; template position as function of time; and force applied by the template position controller as function of time.

In an aspect of the second embodiment, the database of data sets may include: a plurality of previously obtained first data sets; and a quality metric associated with each of the plurality of previously obtained first data sets.

In an aspect of the second embodiment, the model may be between: a rate of change of the contact area as function of time; a rate of change of template position as function of time; and a rate of change of force applied by the template position controller as function of time.

In an aspect of the second embodiment, the first data set may include separation parameters measured at different points in time. The separation parameter may be representative of a state of separation of the template from the cured layer at a specific point in time.

In an aspect of the second embodiment, the different points in time may include: a first measurement time after the second point in time and before the third point in time; and a second measurement time after the first measurement time and before the third point in time.

At least a second embodiment, may be a system for shaping a cured layer on a substrate. The system may comprise: a substrate chuck configured to hold the substrate; a template chuck configured to hold the template; a dispenser configured to dispense formable material onto the substrate; a template position controller configured to bring the template into contact with the formable material; an energy source configured to provide actinic energy so as to cure the formable material between the template and the substrate to form the cured layer, at a first point in time; and a processor. The processor may be configured to send information to the template position controller separating the template from the cured layer on the substrate comprising. The processor may be configured to send instructions to the template position controller to move the template away from the cured layer at a first rate, at a second point in time after the first point in time. The processor may be configured to receive a first data set as a function of time starting after the second point in time The processor may be configured to fit a model of the first data set to a database of historical data sets The processor may be configured to identify a target data set in the historical data sets based on results of the fit of the model of the first data set and information in the target data set The processor may be configured to send instructions to the template position controller to move the template away from the substrate at second rate at a third point in time after the second point in time based on the identified target data set.

In an aspect of the third embodiment, the first data set may include: contact area as function of time; template position as function of time; and force applied by the template position controller as function of time.

In an aspect of the third embodiment, the database of data sets may include: a plurality of previously obtained first data sets; and a quality metric associated with each of the plurality of previously obtained first data sets.

In an aspect of the third embodiment, the model may be between: a rate of change of the contact area as function of time; a rate of change of template position as function of time; and rate of change of force applied by the template position controller as function of time.

In an aspect of the third embodiment, the first data set may include separation parameters measured at different points in time. The separation parameter may be representative of a state of separation of the template from the cured layer at a specific point in time.

In an aspect of the third embodiment, the different points in time may include: a first measurement time after the second point in time and before the third point in time; and a second measurement time after the first measurement time and before the third point in time.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

FIGS. 4A-E are illustrations of simplified field camera images taken during the separation of a template from a cured layer.

Figure 1:
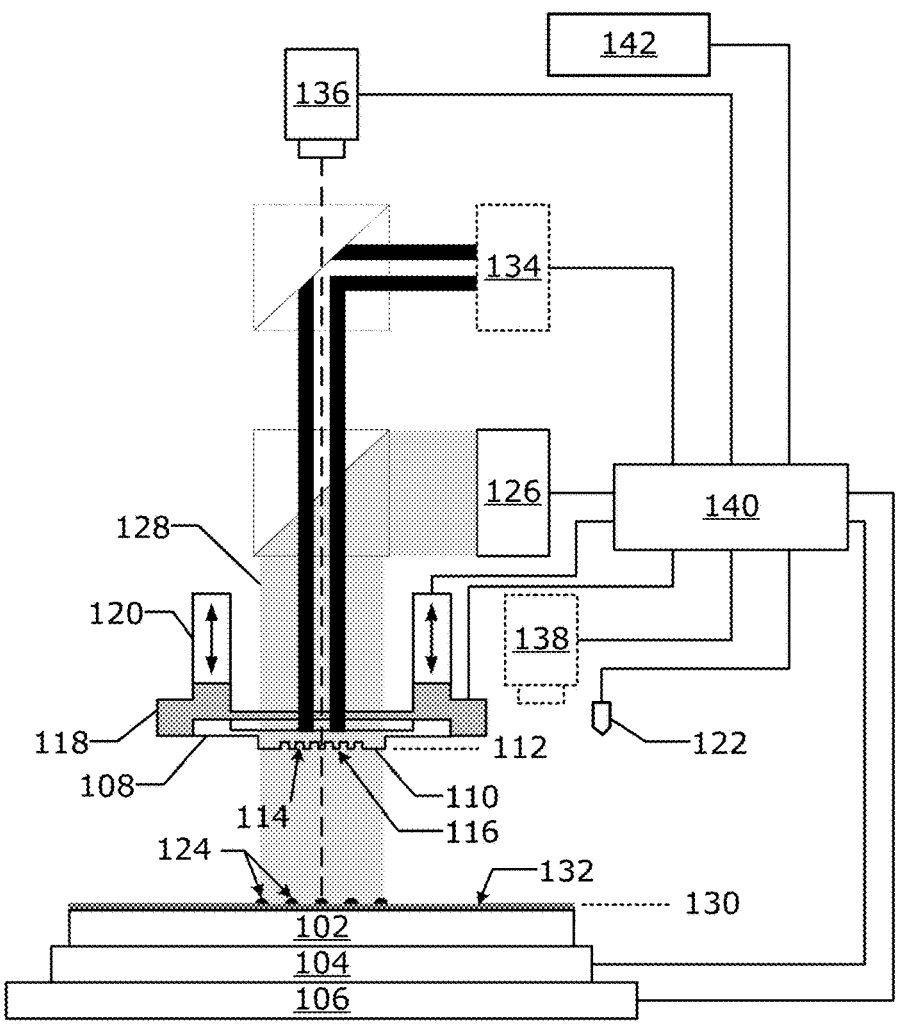
FIG. 1 is an illustration of an exemplary nanoimprint lithography system having a template with a mesa spaced apart from a substrate as used in an embodiment.

Throughout the figures, the same reference numerals and characters, unless otherwise stated, are used to denote like features, elements, components, or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

A shaping process includes contacting a formable material on a substrate with a template, curing the formable material, and separating the template from the cured formable material. During the separation step, the contact area between the template and the solidified layer decreases. At the end of the separation process there is a last point of separation (LPOS) on the solidified layer. There is a problem, where defects occur at the LPOS due to errors in the separation process. What is need is a method of preventing these errors from occurring.

Nanoimprint System (Shaping System)

FIG. 1 is an illustration of a nanoimprint lithography system 100 in which an embodiment may be implemented.

The nanoimprint lithography system 100 is used to form a relief pattern on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head include one or more actuators such as voice coil motors, piezoelectric motors, linear motor, nut and screw motor, etc., which are configured to move the template chuck 118 relative to the substrate in at least the z-axis direction, and potentially other directions (e.g. x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more positioning components. In an alternative embodiment, the fluid dispenser 122 and the imprint head 120 move independently from each other. The fluid dispenser 122 may be used to deposit liquid formable material 124 (e.g., polymerizable material) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has made contact with the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field is illustrated as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 is illustrated as a dashed line. The optical axis of the field camera 136 as illustrated in FIG. 1 is straight but may be bent by one or more optical components. The field camera 136 may include one or more of a CCD, a sensor array, a line camera, and a photodetector which are configured to gather light that wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108, the separation of the template 108 from cured formable material, and can be used to keep track the progress over the imprinting process.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as a lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc. to modulate the spatial temporal distribution of thermal radiation. The nanoimprint lithography system may further comprise one or more optical components which are used to combine the actinic radiation, the thermal radiation, and the radiation gathered by the field camera 136 onto a single optical path that intersects with the imprinting field when the template 108 comes into contact with the formable material 124 on the substrate 102. The thermal radiation source 134 may send the thermal radiation along a thermal radiation path (which in FIG. 1 is illustrated as 2 thick dark lines) after the template 108 that has made contact with the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 may be on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136 and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general purpose computer. The processor 140 may be a purpose built controller or may be a general purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (e.g. UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124 forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form the planar layer with a featureless patterning surface 112.

The imprinting process may be done repeatedly in a plurality of imprinting fields that are spread across the substrate surface 130. Each of the imprinting fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include fluid control features which are used to prevent extrusions. In an alternative embodiment, the substrate 102 has only one imprinting field which is the same size as the substrate 102 or the area of the substrate 102 which is to be patterned with the mesa 110. In an alternative embodiment, the imprinting fields overlap. Some of the imprinting fields may be partial imprinting fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprinting field. The patterned layer may also include one or more features such as protrusions which extend above the residual layer having a thickness. These protrusions match the recesses 114 in the mesa 110.

Template

Figure 2:
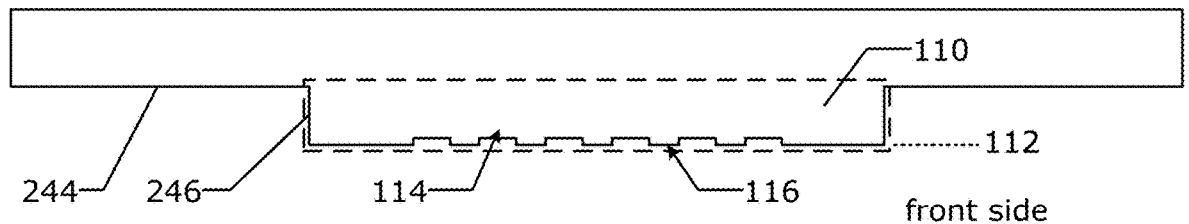
FIG. 2 is an illustration of an exemplary template that may be used in an embodiment.

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110. The mesa sidewalls 246 surround the mesa 110. In an embodiment in which the mesa is round or has rounded corners, the mesa sidewalls refer to a single mesa sidewall that is a continuous wall without corners.

Imprinting Process

Figure 3:
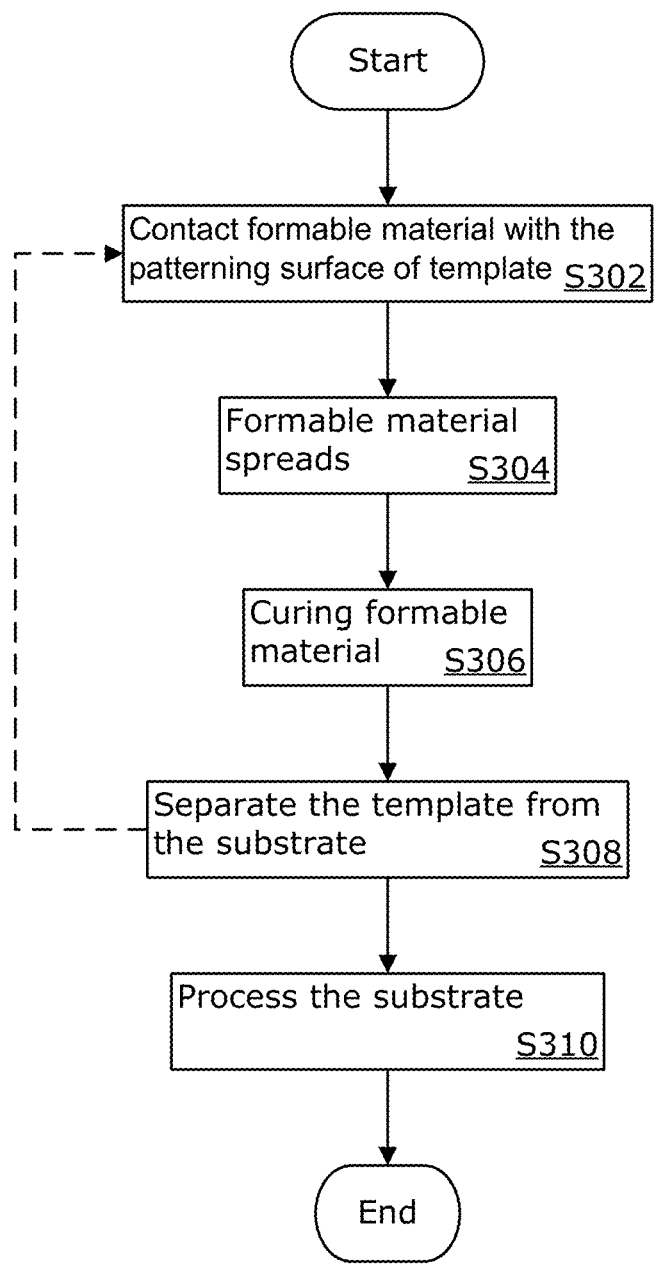
FIG. 3 is a flowchart illustrating an exemplary imprinting method as used in an embodiment.

FIG. 3 is a flowchart of an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control imprinting process 200.

In an alternative embodiment, the imprinting process 300 is used to planarize the substrate 102. In which case, patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. In a dispensing step, the processor 140 may cause the fluid dispenser 122 to dispense formable material onto imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i.

After, the droplets are dispensed, then a contacting step S302 may be initiated, the processor 140 may cause one or both of the substrate positioning stage 106 and a template positioning stage to bring the patterning surface 112 of the template 108 into contact with the formable material 124 in imprinting field i.

During a spreading step S304, the formable material 124 then spreads out towards the edge of the imprinting field i and the mesa sidewalls 246. The edge of the imprinting field may be defined by the mesa sidewalls 246. How the formable material 124 spreads and fills the mesa can be observed via the field camera 136 and may be used to track a progress of a fluid front.

In a curing step S306, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112 at a first point in time.

In a separation step S308, the processor 140 uses one or more of the substrate chuck 104, the substrate positioning stage 106, template chuck 118, and the imprint head 120 to separate the patterning surface 112 of the template 108 from the cured formable material on the substrate 102 starting at a second point in time after the first point in time.

If there are additional imprinting fields to be imprinted then the process moves back step S302. In an embodiment, additional processing is performed on the substrate 102 in a processing step S310 so as to create an article of manufacture (semiconductor device). In an embodiment, each imprinting field includes a plurality of devices.

The further processing in processing step S310 may include etching processes to transfer a relief image into the substrate that corresponds to the pattern in the patterned layer. The further processing in processing step S310 may also include known steps and processes for article fabrication, including, for example, curing, oxidation, layer formation, deposition, doping, planarization, etching, formable material removal, dicing, bonding, and packaging, and the like. The substrate 102 may be processed to produce a plurality of articles (devices).

Separation Step

It is important in the imprinting process 300 that defect generation be kept to an absolute minimum. Defects during the imprinting process 300 can occur from a number of sources. One defect source can arise during the separation step S308. These defects are may be referred to as separation defects and can take the form of collapsed features or features that are torn away from the substrate.

These defects can occur during the separation process S308 or during last point of separation (LPOS). Separation of the template 108 from the cured formable material 124 may require generating and maintaining a separation angle between the template 108 and substrate 102 as the separation proceeds. This may be accomplished by the application of a tensional force to the template 108 and/or the substrate 102 that is sufficient to create a bending in the template 108 or substrate 102 in order to establish and maintain such a separation angle. The template chuck 108 and/or the substrate chuck 102 may be configured to supply these forces. Such bending can impart a spring-like stored or potential energy to the template 108 and/or substrate 102. As separation continues, additional tensional force is imparted, increasing template and substrate bending. As a result, stored energy within the substrate and template continues to grow until the point that the surface adhesion and frictional forces holding the template 108 and substrate 102 together are overcome by the applied tensional force. At this point, the stored energy of the template 108 and substrate 102 is released and converted to kinetic energy that urges the template 108 and substrate 102 back to their unbent state, resulting in an accelerated and uncontrolled separation process that is particularly vulnerable to creating LPOS defects.

The sequence for such a separation under these conditions is further illustrated with reference to FIGS. 4A-4E which are simplified field camera images of the separation process S302 as it evolves over time. Contact area 448 represents the area in which template 108 and the cured formable material 1124 are still in contact. Separated area 450 designates that area of the template 108 where separation has already occurred. Contact line 452 indicates a line of demarcation between the contact area 448 and the separated area 450. The contact line 452 may also be considered to mark the separation front as separation may proceed from the perimeter of the template 108 to its center. FIG. 4A shows image 454a taken after the initiation of separation of the template from the cured formable material. FIGS. 4B, 4C, and 4D show subsequent images 454b, 454c, and 454d which were taken at regular intervals. As can be appreciated, the separation occurring from image 301 through 304 is somewhat controlled, even though the separation front moves non-uniformly; that is the separation lacks radial uniformity. The last image 454e (FIG. 4E), however, was captured very soon after image 304 (FIG. 4D). In preceding image 304, contact area 448 is almost 50% of the initial contact area; by image 305 the contact area is reduced to zero. Thus, in a short period of time, the resultant buildup of potential energy is rapidly converted to kinetic energy, and a sudden uncontrolled separation of the template occurs (FIG. 4D to FIG. 4E).

Figure 5A:
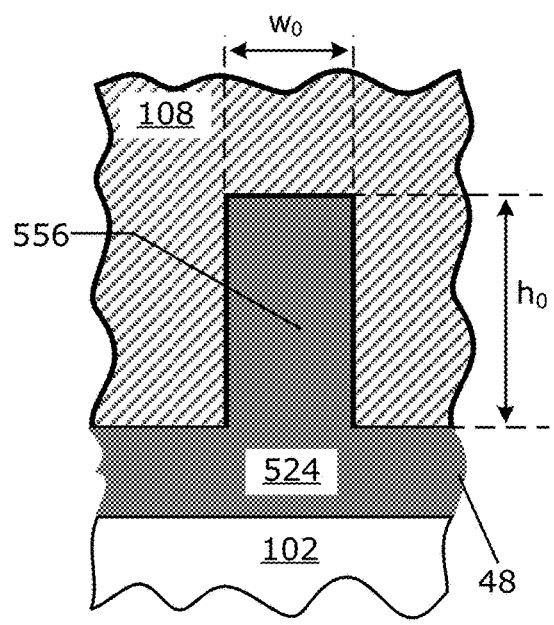
FIGS. 5A-D are illustrations of a portion of a patterned layer as a template is separated from a cured layer.
Figure 5B:
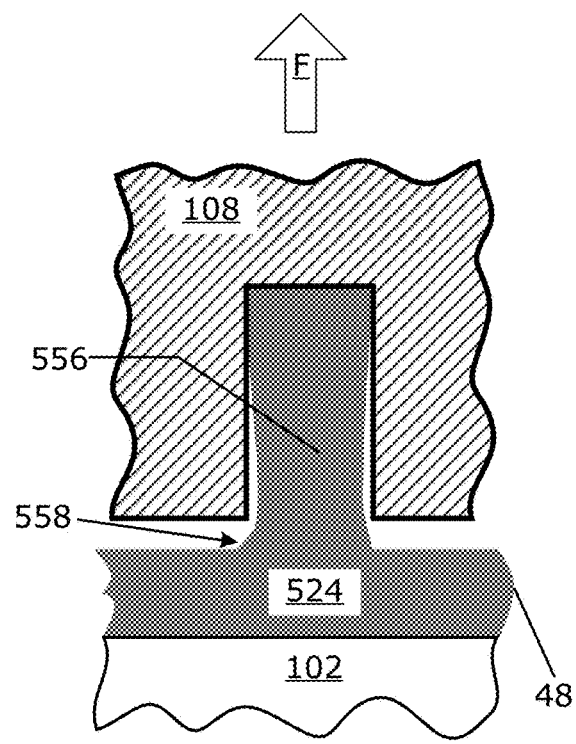
Figure 5C:
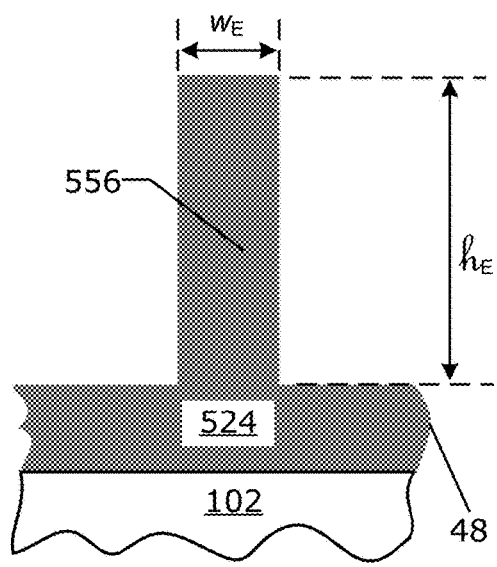
Figure 5D:
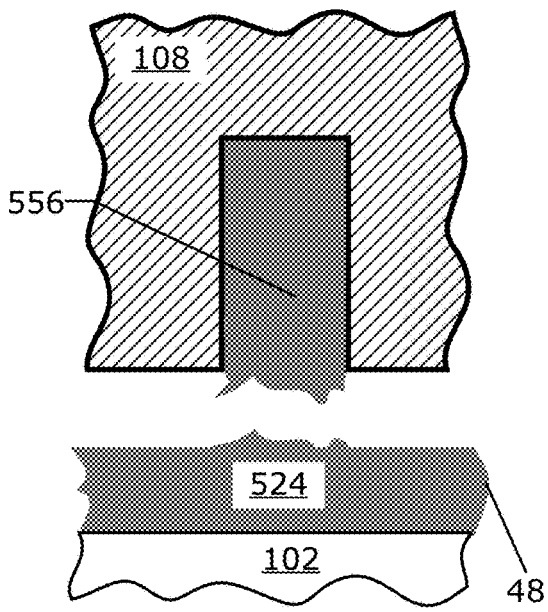

The applicant has determined that separation defects can be induced at the LPOS under certain circumstances. This defect mechanism can be further understood with reference to FIGS. 5A-5D. FIG. 5A shows a portion of template 108 in contact with patterned layer 524 formed on substrate 102. As illustrated in FIGS. 5A-5D, the patterned layer 524 includes a feature 556 (having height $h_0$ and width $w_0$) that has been formed within the corresponding recess of the template 108. As separation force F is applied, as is depicted in FIG. 5B, separation of template 108 starts at a base 558 of feature 556. Under some separation trajectories, this can cause an elongation of feature 556, even as base 558 of feature 556 shrinks away from the sides of the recess near the base 558. The result of such elongation is depicted in FIG. 5C where feature 556 is both thinner and taller than the original feature dimension (i.e., $w_E<w_0$ and $h_E>h_0$). This effect alone can alter the feature critical dimensions (CDs) across the LPOS area, and such CD variation alone can produce device defects upon subsequent processing. Worse still, such elongation can cause denser features to collapse upon another altogether, rendering the final pattern unusable. In the extreme case, as depicted in FIG. 5D, the elongation proceeds until pattern feature 556 shears away from patterned layer 524 altogether, resulting in missing features in the pattern and a resultant plugging defect in the template 108 (i.e., recess remains plugged with the sheared-off feature 556). The end result is that various unwanted defects are generated at the LPOS.

One method of addressing this is to control the rate of separation so that LPOS defects do not occur. This can be difficult to accomplish for a variety of reasons. Near the end point of the separation, the rate of change of the measured contact area can be very high such that there is not enough time to adjust the separation rate and prevent LPOS defects. This can also create stalling and stiction issues if the separation rate becomes too slow. The applicant has found that using feedback to make adjustments to the rate of separation in a timely enough matter is difficult to implement. By the time a feedback system can detect that a LPOS defect is likely to occur, it is difficult for the feedback system to implement a change that can prevent the LPOS defect.

A feedback loop (that may include a field camera 136 which measures contact area 448 and feeds the contact area 448 to a processor 140 which controls the imprint head 120) based control system can be used at the beginning of the separation process but it can be difficult to use at the end of separation process because the template 108 and the patterned layer 524 are separating faster than the response time of the separation system.

Separation Trajectory

The applicant has found that the field camera 136 can be used to monitor the contact area 448 during separation. The applicant has also found that by tracking the contact area 448 and how it changes, an ideal separation trajectory can be selected, based on the current contact area 448 and historical data. A separation trajectory is a list of imprint head positions over time. In an embodiment, the separation trajectory is a list of desired imprint head positions that are sent to the position controller. The position controller will then make an effort to achieve the separation trajectory by changing one or more of a current, voltage, or other control parameter to achieve the separation trajectory. The position controller may use one or more of a feedforward, feedback, look up table, PID loop, or other control scheme in order achieve the separation trajectory within the limitations of the position control system. In an embodiment, the separation trajectory is the imprint head 120 vertical displacement of the template 108 relative to the substrate 102 over time. An input voltage which is supplied to a position controller and an input pressure supplied to the template chuck 118 are induced to put the imprint head 120 in a desired position, during which time the actual position is measured with a position sensor. The measured position is used to adjust the input voltage and input pressure to attempt to get the imprint head closer to a desired position at any given time. This predicted ideal trajectory can then be used to control the imprint head 120 so that LPOS defects may be prevented. In an embodiment, the field camera 136 does not need to be high frequency since it does not directly control the template position.

Previous imprinting steps may be used to create a database of historical data. This historical data may include but is not limited to: trajectory data (the trajectory data may include is a list of the imprint head positions over time); contact area; center position of the contact are relative to the center of the template along a first axis (x) and a second axis (y); template position; and separation force data, energy supplied one or more actuators, trajectory that is requested of the position controller, and measured position of the template relative to the substrate, all taken during previous separation steps. These historical data sets may then be categorized into "good" and "bad" scores based on the imprinting performance outcome (LPOS defects, etc.).

Building the Historical Database

During separation, separation trajectory may include one or more variables that describe the separation of the template from the cured formable material over time. Later, analysis of the separation is done to determine the level to which separation defects have occurred, and a score is given which represents the overall level of defects. In an embodiment, the score is a binary pass/fail score. In another embodiment, the score is a rank or number. The score, rank, or number may be associated with the number, size, and/or position of the defects. This score is then associated with the previously saved separation trajectory and contact area data in the database. In an embodiment, the database is built up over time and at some point contains enough diversity of cases to be considered rich enough for use in production.

Once the historical database has enough cases for production use, an embodiment may be implemented that makes use of a method of controlling the imprint head during separation that makes use of the historical database. This method may periodically monitor the separation trajectory, contact area, and/or additional variables. The periodically monitored measurements may then be compared to data in the historical database using regression analysis. In an embodiment, a trajectory is compared to each trajectory in the historical database using a curve fitting technique such as RMSE. In an embodiment, a short list of the historical trajectories are identified and sorted based on the level of fit (lowest error). If the top trajectory in the sorted list is bad or does not have a score or rank that is above a threshold, then we try the next best, and so on. Once the top-fitting trajectory has been selected, this trajectory is then used as a model to control remainder of current separation of the template 108 from the cured formable material. In an embodiment, if there are no trajectories in which the error is above an error threshold and are good and/or has rank or score that is above a score threshold, then adjustments can be made to the control the current trajectory such that it may attempt to follow the trajectory has the lowest error and is good or a score or trajectory that is above a threshold.

By using selected trajectory data from previous successful separations, along with current template position and contact area, a method predicts an ideal separation trajectory. This ideal trajectory can by dynamically generated in real-time, and fed-forward to the template position controller at a constant cadence.

Separation Process Based on Historical Database

Figure 6:
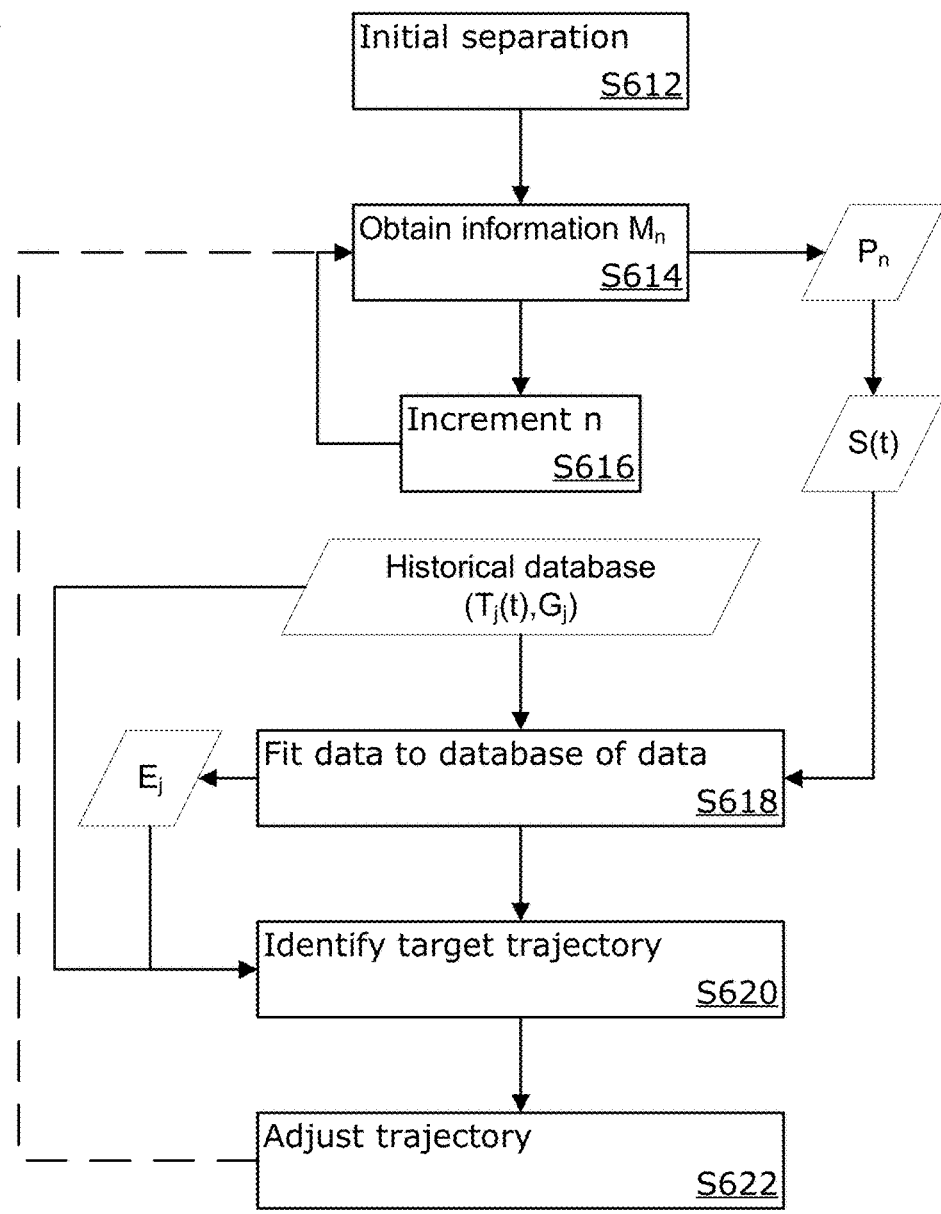
FIG. 6 is a flowchart illustrating a separation process as used in an embodiment.

The separation process S308 as illustrated in FIG. 6 may include an initial separation step S612 of using the imprint head to impart an initial separation force $F_0$ by sending instructions to a template position controller to move the template 108 away from the cured layer of formable material at a first rate at a second point in time. The second point in time is after a first point in time. In which the first point in time is a time at which the formable material is cured. The template position controller may include a processor that receives instructions in the form of one or more analog and/or digital signals. In response to instructions the template position controller may then send a voltage, current, and/or digital signal to one or more actuators and/or pressure controllers.

The separation process S308 may also include an initial measurement step S614 in which the processor 140 receives a data set $M_n$ after the initial separation. The data set $M_n$ includes information that is representative of a separation state of the template from the cured formable material. The data set may include an image of the contact area after the first initial separation force is applied that is captured with the field camera 136. The processor 140 may then be used to estimate one or more representative parameters $P_n$ such as (contact area, centroid x position, centroid y position, contact area circumference, template curvature, measured position of the imprint head, etc.). An index n may be incremented in a step S616 and step S614 may be repeated until the template 108 is completely separated from the cured formable material. This will allow a time series of measurements $M_n$ and a time series of representative parameters $P_n$ forming an estimated separation trajectory S(t).

The separation process S308 may also include a fitting step S618 of fitting the estimated separation trajectory S(t) to each of the trajectories $T_j(t)$ in a historical database of trajectories $T_j(t)$ and grades $G_j$. The fitting step S618 may include calculating an estimate of the error $E_j$ of the fit between estimated separation trajectory S(t) and each of the trajectories $T_j(t)$. The error $E_j$ is a fitting metric that is representative of how well the estimated separation trajectory S(t) fits a specific trajectory $T_j(t)$. In an embodiment, the lower the error $E_j$ the better the fit of the estimated separation trajectory S(t) to a specific trajectory $T_j(t)$. In an alternative embodiment, the closer to the error $E_j$ is to a reference value (1 when the error is a coefficient of determination) the better the fit. In an embodiment, the separation trajectory S(t) and each of the trajectories are $T_j(t)$ are multidimensional (for example they may include both contact area and measured position) and the estimate of the error $E_j$ is across all of the dimensions of the trajectories.

The grade $G_j$ is a quality metric that represents the quality of the separation performed by the specific trajectory $T_j(t)$. In an embodiment, the grade $G_j$ is a binary pass/fail score. In another embodiment, the grade $G_j$ is a rank or number. In another embodiment, the grade $G_j$ may be associated with the number, size, and/or position of the LPOS defects. In another embodiment, the grade $G_j$ is independent of other defects such as when features are not filled by formable material or when formable material extrudes beyond the imprint field.

The separation process S308 may also include a target trajectory identification step S620. In an embodiment, the processor 140 identifies a target trajectory based on the errors $E_j$ and the grades $G_j$ associated with each trajectory. In a case in which the grades $G_j$ are binary, the identified target trajectory has a good grade and the best error $E_j$. In a case in which the grades $G_j$ are non-binary values. There is a threshold $G_{threshold}$ by which trajectories are judged, grades $G_j$ on one side of the threshold $G_{threshold}$ may be considered good and grades $G_j$ on the other side of the threshold $G_{threshold}$ may be considered bad. In an embodiment, when $G_j$ is greater than the threshold $G_{threshold}$ then the trajectory is considered good and is otherwise bad. In an alternative embodiment, when $G_j$ is less than the threshold $G_{threshold}$ then the trajectory is considered good and is otherwise bad. In an embodiment, the target trajectory is that specific trajectory with the best error $E_j$ and the grade is on the good side of the grade threshold $G_{threshold}$. In an embodiment, the target trajectory is that specific trajectory with the error $E_j$ on the good side of an error threshold $E_{threshold}$ and has the best grade. In an embodiment, the target trajectory is one of a subset of trajectories with the error $E_j$ on the good side of an error threshold $E_{threshold}$ and is on the good side of a grade threshold $G_{threshold}$.

The separation process S308 may also include a trajectory adjustment step S622 in which the initial separation trajectory is adjusted in view of the identified target trajectory. The processor 140 may send a second set of instructions to the template position controller to move the template 108 away from the substrate at second separation rate at a third point in time after the second point in time based on the identified target separation trajectory. The processor 140 may send a second set of instructions to $F_1$ to separate the template 108 from the substrate 102. In an embodiment, the second separation rate is maintained until the template is completely separated from the cured formable material. In an alternative embodiment, after step S622, the process may return to step S614 and the process is repeated until the template is completely separated from the cured formable material.

Exemplary Separation Trajectories in the Historical Database

Figure 7A:
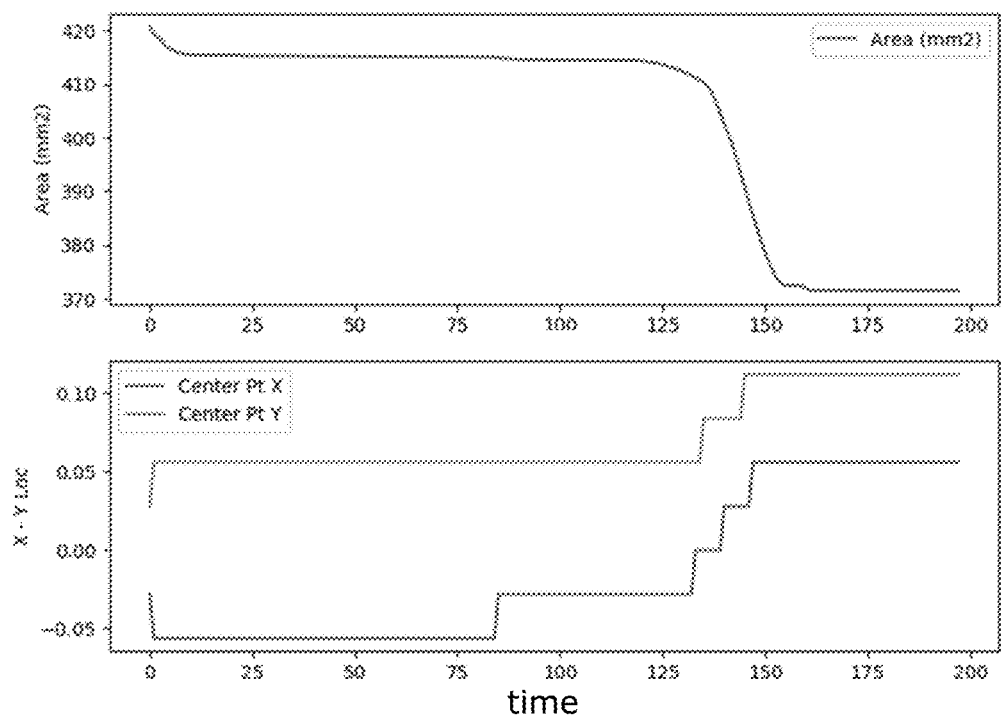
FIGS. 7A-B are illustrations of separation trajectories as used in an embodiment.
Figure 7B:
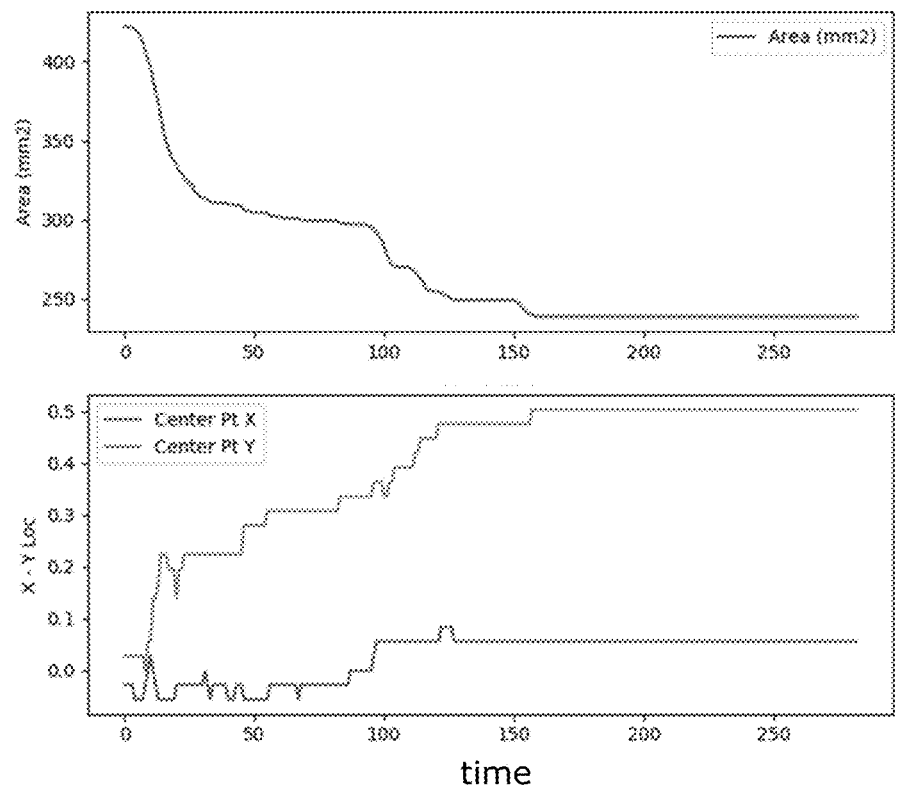

FIG. 7A is an illustration of a good separation trajectory which did not produce a LPOS defect. FIG. 7A illustrates two charts plotting three variables (contact area, center position along the x axis, and center position along the y axis) of a separation trajectory and how it evolves over time for a good separation trajectory. The separation trajectory illustrated in FIG. 7A was determined to be a good separation after the imprinted surface was inspected and it was determined that the imprinted surface produced by the separation trajectory illustrated in FIG. 7A did not produce a LPOS defect. FIG. 7B is an illustration of a bad separation trajectory that did produce a LPOS defect. FIG. 7B illustrates two charts plotting three variables (contact area, center position along the x axis, and center position along the y axis) of a separation trajectory and how it evolves over time for a bad separation trajectory. The separation trajectory illustrated in FIG. 7B was determined to be a bad separation after the imprinted surface was inspected and it was determined that the imprinted surface produced by the separation trajectory illustrated in FIG. 7B produced a LPOS defect.

Separation Trajectory Generation Process Based on Historical Database

In an embodiment, a historical database of trajectories is be used as a starting point to select an appropriate or near appropriate trajectory for a separation using similar conditions such as materials, template feature density, and other imprint properties.

User Interface

An operator may interact with a user interface to the historical database that includes one or more data entry fields, button, and/or charts which are then used to generate a desired separation trajectory.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of separating a template from a cured layer on a substrate comprising:
    curing formable material between the template and the substrate to form the cured layer, at a first point in time;
    sending instructions, starting separation of the template from the cured layer, to a template position controller to move the template away from the cured layer at a first rate, at a second point in time during the separation, after the first point in time;
    receiving, during the separation, a first data set that describes the separation of the template from the cured layer as a function of time starting after the second point in time;
    fitting, during the separation, the first data set that describes the separation of the template from the cured layer as a function of time to a database of historical data sets that describe the separation of the template from the cured layer as a function of time;
    identifying, during the separation, a target data set in the historical data sets based on a level of the fit of the first data set that describes the separation of the template from the cured layer as a function of time and information in the target data set; and
    sending instructions, during the separation, to the template position controller to move the template away from the substrate at a second rate at a third point in time during the separation, after the second point in time based on the identified target data set.

2. The method according to claim 1, wherein the first data set includes:
    a contact area as function of time;
    a template position as function of time; and
    a force applied by the template position controller as function of time.

3. The method according to claim 1, wherein the database of data sets includes:
    a plurality of previously obtained first data sets; and
    a quality metric associated with each of the plurality of previously obtained first data sets.

4. The method according to claim 1, wherein the first data set includes:
    a rate of change of the contact area as function of time;
    a rate of change of template position as function of time; and
    a rate of change of force applied by the template position controller as function of time.

5. The method according to claim 1, wherein the first data set includes:
    separation parameters measured at different points in time;
    wherein the separation parameter is representative of a state of separation of the template from the cured layer at a specific point in time.

6. The method according to claim 5, wherein the different points in time includes:
    a first measurement time during the separation, after the second point in time and before the third point in time; and
    a second measurement time during the separation, after the first measurement time and before the third point in time.

7. A method of manufacturing an article from the cured layer on the substrate, including the method of separating the template from the cured layer on the substrate according to claim 1, further comprising:
    processing the substrate after the template has been separated from the cured layer so as to form one or more articles.

8. The method of manufacturing the article according to claim 7, further comprising:
    dispensing the formable material onto the substrate;
    sending instructions to the template position controller to bring the template into contact with the formable material on the substrate.

* * * * *